(12) United States Patent
Feng et al.

(10) Patent No.: US 7,759,789 B2
(45) Date of Patent: Jul. 20, 2010

(54) LOCAL AREA SEMICONDUCTOR COOLING SYSTEM

(75) Inventors: Kai Di Feng, Hopewell Junction, NY (US); Alvin Jose Joseph, Williston, VT (US); Donald J. Papae, Hopewell Junction, NY (US); Xiaojin Wei, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 194 days.

(21) Appl. No.: 12/013,653

(22) Filed: Jan. 14, 2008

(65) Prior Publication Data

US 2009/0179323 A1    Jul. 16, 2009

(51) Int. Cl.
*H01L 23/38* (2006.01)
*H01L 21/60* (2006.01)

(52) U.S. Cl. .............. 257/712; 257/E23.082; 257/E21.506; 438/122

(58) Field of Classification Search ........ 257/706, 257/712, 708, 709, 713, 703, 720, 777, 796, 257/717, E21.506, E23.101, E23.082, E23.105; 438/106, 121, 122
See application file for complete search history.

(56) References Cited

U.S. PATENT DOCUMENTS

| | | | |
|---|---|---|---|
| 5,032,897 A | 7/1991 | Mansuria et al. | |
| 6,094,919 A | 8/2000 | Bhatia | |
| 6,196,002 B1 | 3/2001 | Newman et al. | |
| 6,596,635 B1 | 7/2003 | Tiku et al. | |
| 6,614,117 B1 | 9/2003 | Tiku et al. | |
| 6,727,422 B2 | 4/2004 | Macris | |
| 2003/0218865 A1 | 11/2003 | Macias | |
| 2004/0017419 A1 | 1/2004 | Lai et al. | |
| 2004/0061218 A1* | 4/2004 | Tilton et al. | 257/710 |
| 2006/0102223 A1* | 5/2006 | Chen et al. | 136/201 |
| 2007/0048896 A1 | 3/2007 | Andry et al. | |
| 2008/0122061 A1* | 5/2008 | Edwards | 257/690 |
| 2009/0140417 A1* | 6/2009 | Refai-Ahmed | 257/707 |

* cited by examiner

*Primary Examiner*—Victor A Mandala
*Assistant Examiner*—Whitney Moore
(74) *Attorney, Agent, or Firm*—Joseph Petrokaitis; Ira D. Blecker

(57) ABSTRACT

A system and method in which a semiconductor chip has electrically inactive metal-filled vias adjacent to a semiconductor device or devices to be cooled and the semiconductor device or devices are preferably surrounded by thermally insulating vias. The metal-filled vias are contacted with a thermoelectric cooler to remove excess heat from the semiconductor device or devices.

20 Claims, 3 Drawing Sheets

LOCAL AREA SEMICONDUCTOR COOLING SYSTEM

BACKGROUND OF THE INVENTION

The present invention is related generally to the field of semiconductor chips and systems that provide temperature control of local area of semiconductor chips during operation.

Advances in integrated circuit technology have led to faster clock frequencies and greater densities of transistors. These advances have resulted in a corresponding increase in the amount of heat generated by the integrated circuits. With large amounts of heat being generated, the problem of efficient heat dissipation has received increased attention.

Low noise is always the design target of almost all electronic circuits, especially for amplifiers. As an example, a low noise amplifier is the first stage of a communication or measurement system. The noise performance of the amplifier thus determines the sensitivity of the whole system. One method of obtaining low noise is the reduction of the semiconductor device temperature because the power density of the thermal noise (which is the most basic noise source) is proportional to the semiconductor device temperature. An integrated circuit is comprised of large numbers of semiconductor devices.

Thermal management today is done by heat sinks, heat spreaders and thermoelectric coolers, all of which cool the environment but not the semiconductor device temperature due to the high thermal resistance material that surrounds a semiconductor device.

It is known to use a thermoelectric cooler to lower the operating temperature of a semiconductor device. A thermoelectric cooler includes a plurality of thermoelectric cooling elements, which are constructed of materials with dissimilar characteristics. The elements are connected electrically in series and thermally in parallel to provide a plurality of thermoelectric couples. Each thermoelectric couple includes one element having a first characteristic and another element having a second characteristic. The thermoelectric couples are connected between two plates which function as a hot side and a cold side of a thermoelectric cooler. The hot side is thermally connected to a heat sink and the cold side is thermally connected to the semiconductor chip.

Thermoelectric cooling is achieved by passing electric current through the thermoelectric cooler. Thermal energy is drawn from the cold side to the hot side at a rate which is proportional to carrier current passing through the circuit and the number of couples. At the hot side, the thermal energy is dissipated by the heat sink. The thermoelectric cooling effect is greatly increased when the dissimilar conducting materials used are semiconducting materials.

The dissimilar semiconducting materials generally used for thermoelectric cooling are N-type material (more electrons than necessary to complete a perfect molecular lattice structure) and P-type material (fewer electrons than necessary to complete a perfect molecular lattice structure, thus providing holes). The extra electrons in the N-type material and the holes in the P-type material are called "carriers" which function to move the thermal energy from the cold side to the hot side.

Mansuria et al. U.S. Pat. No. 5,032,897, the disclosure of which is incorporated by reference herein, discloses a wire bonded integrated circuit chip which is cooled on its backside by a thermoelectric cooler.

Bhatia U.S. Pat. No. 6,094,919, the disclosure of which is incorporated by reference herein, discloses an integrated circuit chip, which is connected to a circuit board with pins, being cooled by a thermoelectric cooler embedded in a lid.

Newman U.S. Pat. No. 6,196,002, the disclosure of which is incorporated by reference herein, discloses an electronic substrate incorporating a thermoelectric cooler. An integrated circuit, which is wire bonded on its front side to the substrate, is contacted on its back side by the thermoelectric cooler.

Tiku et al. U.S. Pat. Nos. 6,596,635 and 6,614,117, the disclosures of which are incorporated by reference herein, disclose a process for forming metal-filled through wafer vias for electrical conductivity and thermal conductivity advantages.

Macris U.S. Pat. No. 6,727,422, the disclosure of which is incorporated by reference herein, discloses a heat sink/heat spreader incorporating a thermoelectric cooler.

Macias U.S. Patent Application Publication 2003/0218865, the disclosure of which is incorporated by reference herein, discloses an integrated circuit chip cooled by a thermoelectric cooler and associated cooling apparatus, including a temperature probe and controller card.

Lai et al. U.S. Patent Application Publication 2004/0017419, the disclosure of which is incorporated by reference herein, discloses a metal-filled through-substrate interconnect for electrical connectivity.

Andry et al. U.S. Patent Application 2007/0048896, the disclosure of which is incorporated by reference herein, discloses metal-filled through wafer vias in a silicon carrier. The through vias are formed for the purpose of electrically connecting a wiring level to a solder bump.

BRIEF SUMMARY OF THE INVENTION

The advantages of the invention have been achieved by providing, according to a first aspect of the invention, a semiconductor cooling system comprising:

a semiconductor chip comprising a semiconductor portion having a plurality of semiconductor devices and a plurality of electrically inactive metal-filled vias extending through the semiconductor portion, the semiconductor chip having a back (inactive) side and a front (active) side;

a thermally conducting layer on the back side of the semiconductor chip and in thermal contact with the plurality of metal-filled vias, wherein the plurality of metal-filled vias in combination with the thermally conducting layer provide a path for the removal of heat from at least one device; and a thermoelectric cooler in contact with the thermally conducting layer.

According to a second aspect of the invention, there is provided a semiconductor cooling system comprising:

a semiconductor chip comprising:

a plurality of semiconductor devices, a plurality of thermally insulating vias surrounding at least one semiconductor device, the plurality of thermally insulating vias providing a thermal insulating wall to confine heat output from the at least one semiconductor device, and a plurality of electrically inactive metal-filled vias adjacent to the at least one semiconductor device, the plurality of metal-filled vias moving the heat output from the at least one semiconductor device to a side of the semiconductor chip; and a thermoelectric cooler in contact with the side of the semiconductor chip.

According to a third aspect of the invention, there is provided a semiconductor cooling system comprising:

a semiconductor chip comprising a semiconductor portion having a plurality of semiconductor devices and a metallization layer portion having a plurality of electrically inactive metal-filled vias, the semiconductor chip having a back (inactive side) and a front (active) side wherein the plurality of metal-filled vias extending through the metallization portion to a front side of the die; and a thermoelectric cooler in contact with the front side of the semiconductor chip.

According to a fourth aspect of the invention, there is provided a method of cooling a semiconductor chip comprising the steps of:

placing a plurality of electrically inactive metal-filled vias adjacent to at least one semiconductor device to be cooled;

surrounding the at least one semiconductor device to be cooled with a plurality of thermally insulating vias so as to provide a thermally insulating wall to confine heat output from the at least one semiconductor device; and contacting the plurality of metal-filled vias with a thermoelectric cooler so as to remove excess heat from the semiconductor device.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
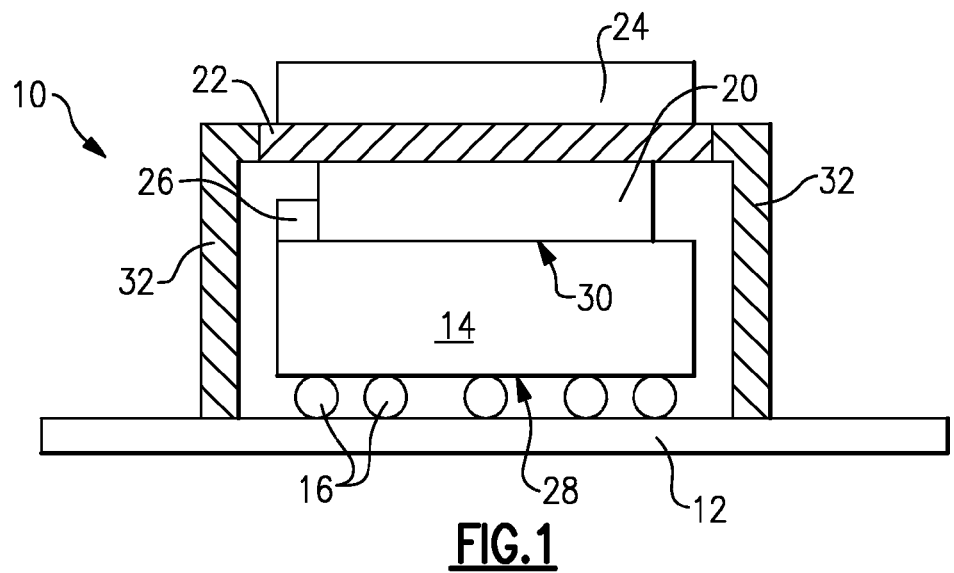
FIG. 1 is a front view in partial cross section of a first assembly according to the present invention in which a semiconductor chip is electrically connected to a package printed circuit board (PCB) by solder balls, usually so-called C4 pads.

Referring now to the Figures in detail, and particularly referring to FIG. 1, there is shown a first assembly 10 according to the present invention. Assembly 10 comprises a package printed circuit board 12, semiconductor chip 14, thermoelectric cooler 20, thermally conducting package lid 22, a temperature sensor 26 and heat sink 24.

Package PCB 12 is a multilayer (usually) wiring board wherein circuits from the semiconductor chip 14 are electrically connected to the next level of packaging such as a system board through the package PCB 12. Package PCB 12 may be, for example, a ceramic based PCB, a printed wiring board or similar packaging structure.

Semiconductor chip 14 is electrically connected to package PCB 12 by solder balls 16. Such solder ball connections are often called controlled collapse chip connections or C-4s or C-4 connections. Semiconductor chip 14 contains metal-filled vias and optionally thermally insulating vias as well which serve to remove heat that is output from the individual semiconductor devices. The metal-filled vias and optional thermally insulating vias will be discussed in more detail hereafter.

The semiconductor chip 14 has a front side 28, also called the active side, which is joined face down onto the package PCB 12. The back side 30 of the semiconductor chip 14, also called the inactive side, has a thermally conducting layer 18 joined to the back side 30. The thermally conducting layer 18 is preferably copper.

Over the thermally conducting layer 18 in the chip 14 is placed a thermoelectric cooler 20. Thermoelectric coolers in general are well known and are commercially available in sizes as small as 1 mm×2 mm from suppliers such as RMT Ltd. in Moscow, Russia and in sizes as small as 4 mm×4 mm from suppliers such as Ferrotec, Nashua, N.H. The thermoelectric cooler 20 covers the metal layer 18, shown in FIG. 2, only for a select number of semiconductor devices which need to be cooled to a temperature much lower than other semiconductor devices. Metal layer 18 covers only those portions of the back side 30 which are adjacent to such select number of semiconductor devices. The remaining portions of the back side 30 are covered by oxide 19, such as $SiO_2$ and may not need to be cooled. Such devices that would likely benefit from a thermoelectric cooler are, for example, low noise amplifiers.

A conventional thermally conducting package lid 22, preferably copper, is placed on the thermoelectric cooler 20. The thermally conducting lid 22 is supported by supports 32 to enclose the subassembly of semiconductor chip 14 and thermoelectric cooler 20. Not shown are under fill and encapsulant which might also be present within the confines of thermally conducting package lid 22 and supports 32.

Lastly, conventional heat sink 24 is placed on thermally conducting package lid 22.

Figure 2:
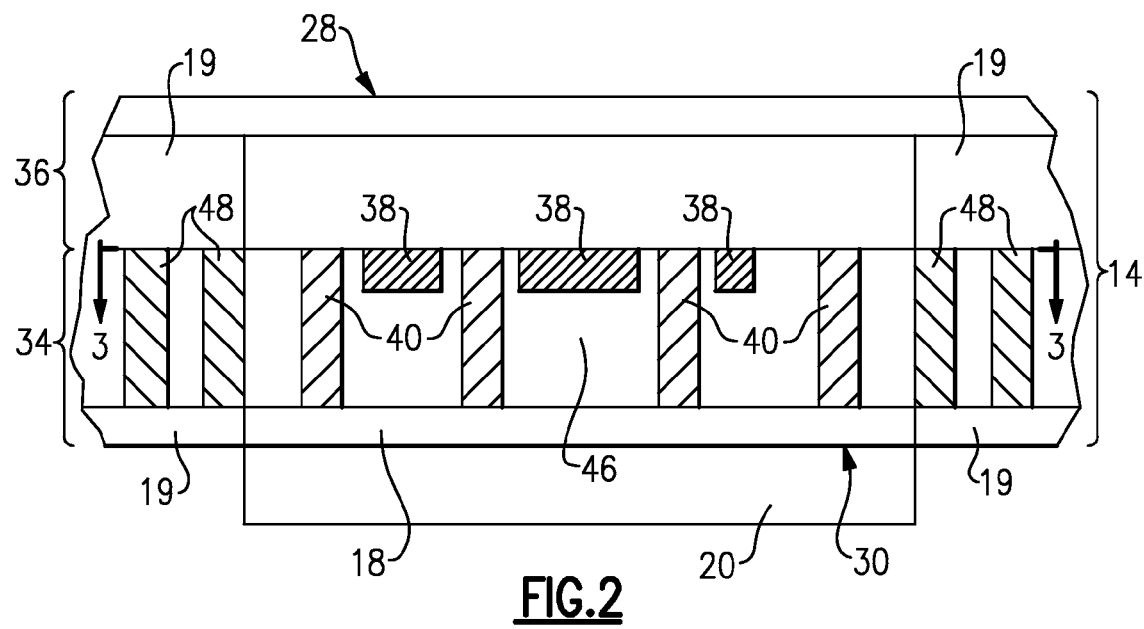
FIG. 2 is a cross section of a portion of the semiconductor chip in FIG. 1 according to the present invention showing metal-filled vias and thermally insulating vias which defined a thermally isolated area to be cooled.

Referring now to FIG. 2, there is shown a cross section of a portion of semiconductor chip 14. Semiconductor chip 14 has been flipped so that the back side 30 is down while the front side 28 is up. The semiconductor portion of semiconductor chip 14 that contains the semiconductor devices is called the front end of the line portion or FEOL 34 while the portion of semiconductor chip 14 that contains just metallization and no semiconductor devices is called the back end of the line portion or BEOL 36. FEOL 34 contains several critical devices 38 which are desired to be cooled. FEOL 34 in addition contains metal-filled vias 40 which extend through FEOL 34. Preferably, the metal-filled vias 40 extend only through FEOL 34, as shown in FIG. 2. The metal-filled vias 40 are preferably situated in proximity to the semiconductor devices 38 such as between the semiconductor devices 38 as also shown in FIG. 2. The metal-filled vias 40 should not contact the semiconductor devices 38; however, metal-filled vias 40 should make good thermal contact with thermally conducting layer 18 so that the heat is removed to 18 through the metal-filled vias 40. The thermal isolated material filled-vias 48 define a thermally isolated area to be cooled. The metal-filled vias 40 provide no function to the semiconductor chip 14 other than as a path for the heat to be removed to the thermally conducting layer 18. That is, the metal-filled vias 40 are electrically inactive.

Figure 3:
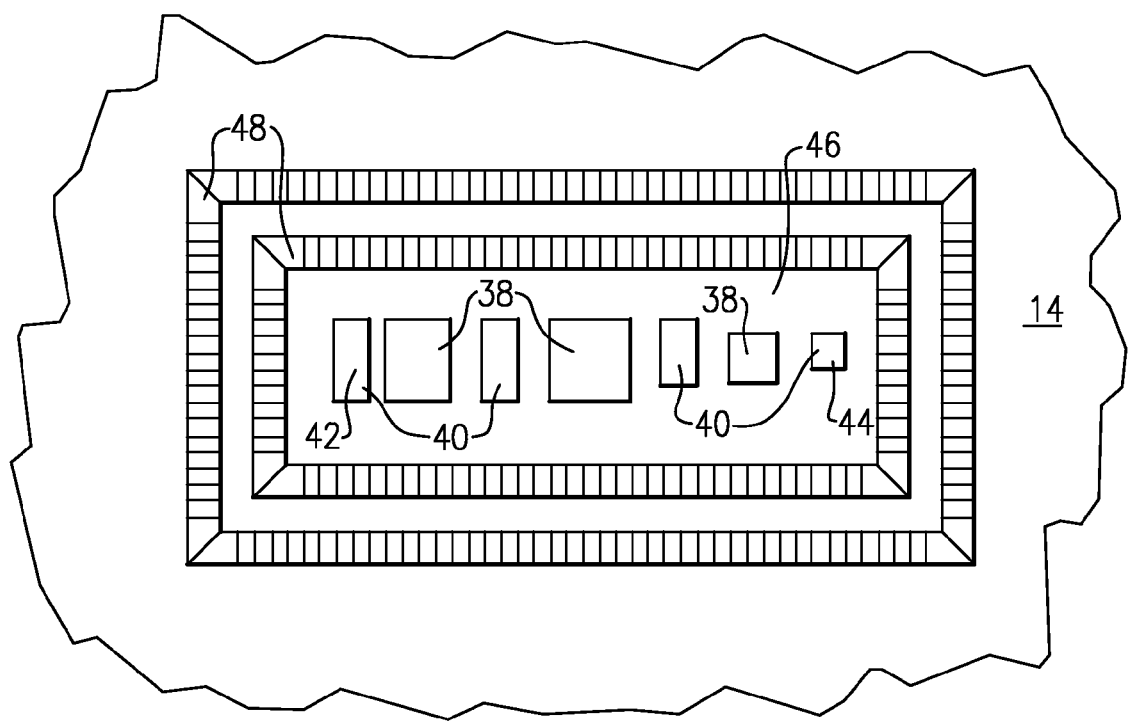
FIG. 3 is a view of the semiconductor chip in FIG. 2 in the direction of arrows 3-3.

Another view of semiconductor chip 14 is shown in FIG. 3 in the direction of arrows 3-3 of FIG. 2. Semiconductor devices 38 are spaced apart with metal-filled vias 40 placed in between. Not shown are various wirings that might connect the semiconductor devices 38 to each other or to other wiring features. The metal-filled vias 40 can be rectangular in cross section such as shown at 42 or square in cross section such as shown as 44. The purpose of metal-filled vias 40 is to remove heat from semiconductor devices 38 and due to their proximity to the semiconductor devices 38, heat may be removed very efficiently to thermally conducting layer 18. Without metal-filled vias 40, heat could not be removed very efficiently from the semiconductor devices 38 since semiconductor material 46, such as silicon, is not a very good conductor of heat. As shown in FIG. 2, thermoelectric cooler 20 may only cover the critical area with devices 38.

In a preferred embodiment of the present invention, semiconductor chip 14 may also contain thermally insulating vias 48. It is preferred that thermally insulating vias 48 are only in FEOL 34. The thermally insulating vias 48 may be any thermally insulating material that is compatible with the overall semiconductor structure. An example of one such material is silicon dioxide ($SiO_2$). The thermally insulating vias 48 serve to localize the heat output from the semiconductor devices 38 which is then removed by the metal-filled vias 40. The thermally insulating vias 48 are separated by a small gap of silicon (not shown). There should be at least one row of thermally insulating vias 48; two rows as shown in FIGS. 2 and 3 would be even better.

Figure 7:
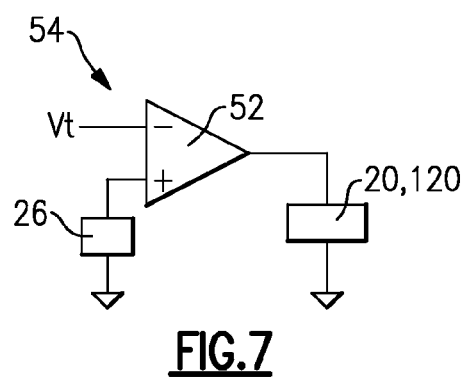
FIG. 7 is a circuit schematic of a thermal sensor temperature controller utilized for the present invention.

FIG. 7 is a block circuit diagram for the closed loop control circuit 54 according to the present invention which comprises an amplifier 52 which is located outside of the area to be cooled, a thermal sensor 26 located on the cool side of the thermoelectric cooler 20 and thermoelectric cooler 20. Amplifier 52 has differential inputs wherein the negative input is connected to a temperature setting voltage Vt and the positive input is connected to the thermal sensor 26 which generates a voltage proportional to the temperature of the semiconductor devices 38 as measured by the thermal sensor 26. The output of the amplifier is connected to the thermoelectric cooler 20 to form a negative feed back loop. If the temperature of the semiconductor devices 38 is higher than the setting value, the thermal sensor voltage is higher than Vt and the amplifier output voltage is higher wherein more current is provided to the thermal electrical cooler 20 which moves more heat from the cold side of the thermoelectric cooler 20 to the hot side and drops the temperature of the semiconductor devices 38 down. A balance status is thus established to keep the temperature of the semiconductor devices 38 constant.

Figure 4:
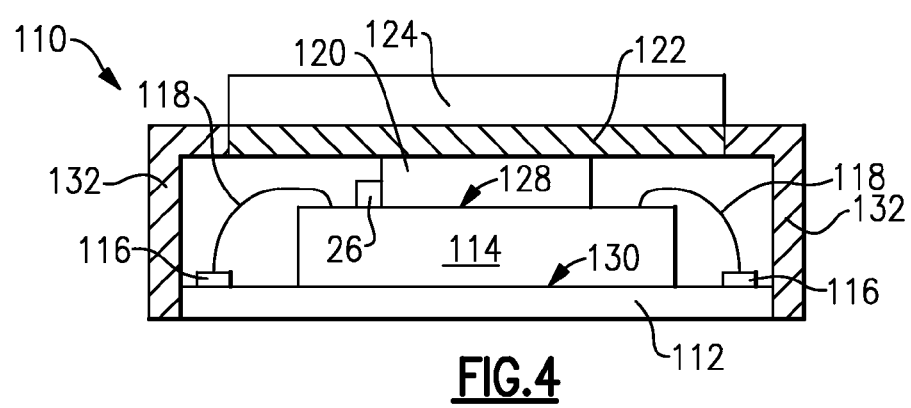
FIG. 4 is a front view in partial cross section of a second assembly according to the present invention in which a semiconductor chip is electrically connected to a package PCB by wire bonds.

Referring now to FIG. 4, there is shown a second assembly 110 according to the present invention. Assembly 110 comprises a package PCB 112, semiconductor chip 114, thermoelectric cooler 120, thermally conducting lid 122, thermal sensor 26 and heat sink 124.

As in the first assembly according to the present invention, package PCB 112 is a multilayer (usually) wiring board and may be, for example, a ceramic based PCB, a printed wiring board or similar packaging structure.

Semiconductor chip 114 is electrically connected by wires 118 to pads 116 on package PCB 112. In this embodiment, semiconductor chip 114 is wire bonded to package PCB 112. Semiconductor chip 114 contains metal-filled vias and, in a preferred embodiment, thermally insulating vias similar to semiconductor chip 14 except that the location of the metal-filled vias is different than for semiconductor chip 14, as will be discussed in more detail hereafter.

In the case of semiconductor chip 114, the front side (active side) 128 is joined face side up while back side (inactive side) 130 is joined face side down onto package PCB 112.

On top of the front side 128 of semiconductor chip 114 is placed a thermoelectric cooler 120 which may be the same or similar thermoelectric cooler 20 discussed with respect to the first embodiment of the present invention. The thermoelectric cooler 120 is limited to covering only the central portion of front side 128 of semiconductor chip 114 under which a thermally isolated area is defined and to be cooled. The periphery of semiconductor chip 114 must be left uncovered due to the presence of the wire bonds along the periphery of the front side 128 of semiconductor chip 114.

Next, a conventional thermally conducting lid 122, preferably copper, is placed on the thermoelectric cooler 120. The thermally conducting lid 122 is supported by supports 132 to enclose the subassembly of semiconductor chip 114, and thermoelectric cooler 120. Not shown are encapsulant which might also be present within the confines of thermally conducting lid 122 and supports 132.

Lastly, conventional heat sink 124 is placed on thermally conducting lid 122.

Figure 5:
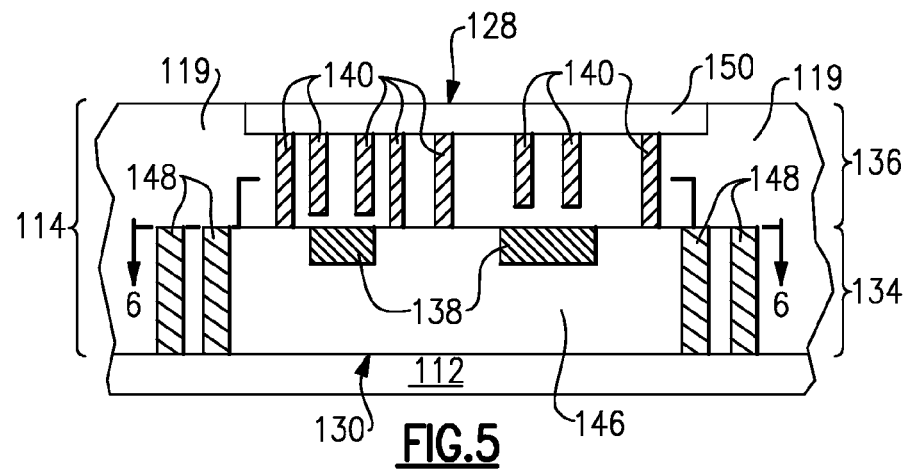
FIG. 5 is a cross section of a portion of the semiconductor chip in FIG. 4 according to the present invention showing metal-filled vias and thermally insulating vias which define a thermally isolated area to be cooled.

Referring now to FIG. 5, there is shown a cross section of a portion of semiconductor chip 114. The semiconductor portion of semiconductor chip 114 that contains the semiconductor devices is called the front end of the line portion or FEOL 134 while the portion of semiconductor chip 114 that contains just metallization and no semiconductor devices is called the back end of the line portion or BEOL 136. FEOL 134 contains several critical devices 138 which are desired to be cooled. In the case of semiconductor chip 114, BEOL 136 contains the metal-filled vias 140 which extend through BEOL 136 to analog metal layer 150. Preferably, the metal-filled vias 140 extend only through BEOL 136, as shown in FIG. 5. The metal-filled vias 140 are preferably situated in proximity to the semiconductor devices 138 but should not contact the semiconductor devices 138. Where metal-filled vias 140 are just above semiconductor devices 138, such metal-filled vias 140 are slightly shortened to avoid contact with the semiconductor devices 138. The metal-filled vias 140 provide no function to the semiconductor chip 114 other than as a path for the heat to be removed to the analog metal layer 150. That is, the metal-filled vias 140 are electrically inactive.

Figure 6:
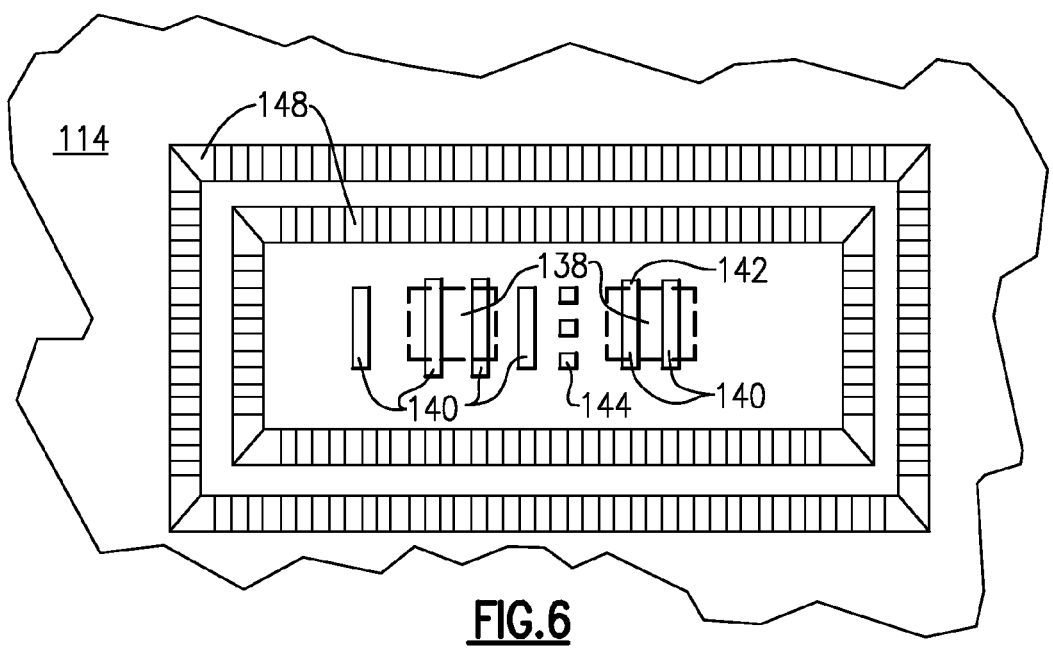
FIG. 6 is a view of the semiconductor chip in FIG. 5 in the direction of arrows 6-6.

Another view of semiconductor chip 114 is shown in FIG. 6 in the direction of the plane indicated by the arrows 6-6 of FIG. 5. Semiconductor devices 138 are spaced apart with metal-filled vias 140 placed above them. Not shown are various wirings that might connect the semiconductor devices 138 to each other or to other wiring features. Again, the metal-filled vias 140 can be rectangular in cross section such as shown at 142 or square in cross section such as shown as 144. The purpose of metal-filled vias 140 is to remove heat from semiconductor devices 138 and due to their proximity to the semiconductor devices 138, heat may be removed very efficiently. Without metal-filled vias 140, heat could not be removed very efficiently from semiconductor devices 138 since semiconductor material 146 in FIG. 5, such as silicon, is not a very good conductor of heat.

In a preferred embodiment of the present invention, semiconductor chip 114 may also contain thermally insulating vias 148. It is preferred that the thermally insulating vias 148 are only in FEOL 134. As mentioned above, the thermally insulating vias 148 may be any thermally insulating material that is compatible with the overall semiconductor structure. The thermally insulating vias 148 serve to localize the heat output from the semiconductor devices 138 which is then removed by the metal-filled vias 140. The thermally insulating vias 148 are separated by a small gap of silicon. There should be at least one row of thermally insulating vias 148; two rows as shown in FIGS. 5 and 6 would be even better.

And, the second assembly 110 according to the present invention could utilize a closed loop control circuit 26 as shown in FIG. 7.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

The invention claimed is:

1. A semiconductor cooling system comprising:
a semiconductor chip comprising a semiconductor portion having a plurality of semiconductor devices and a plurality of electrically inactive metal-filled vias extending through the semiconductor portion, the semiconductor chip having a back (inactive) side and a front (active) side;
a thermally conducting layer on the back side of the semiconductor chip and in thermal contact with the plurality of metal-filled vias, wherein the plurality of metal-filled vias in combination with the thermally conducting layer provide a path for the removal of heat from at least one device; and
a thermoelectric cooler in contact with the thermally conducting layer.

2. The semiconductor cooling system of claim 1 further comprising a plurality of thermally insulating vias extending through the semiconductor portion and surrounding at least one semiconductor device, the plurality of thermally insulating vias providing a thermal insulating wall to confine heat output from the at least one semiconductor device.

3. The semiconductor cooling system of claim 1 wherein the metal-filled vias are situated between, and not in contact with, the plurality of semiconductor devices.

4. The semiconductor cooling system of claim 2 wherein the plurality of metal-filled vias and plurality of insulating vias extend only through the semiconductor portion.

5. The semiconductor cooling system of claim 1 wherein the semiconductor chip is joined face side down onto a printed circuit board by solder ball connections.

6. The semiconductor cooling system of claim 1 further comprising a thermally conducting lid in contact with the thermoelectric cooler and a heat sink in contact with the thermally conducting lid.

7. The semiconductor cooling system of claim 1 further comprising a thermal sensor to control an output of the thermoelectric cooler.

8. The semiconductor cooling system of claim 7 wherein the thermal sensor and thermoelectric cooler are configured in a closed-loop feedback system.

9. A semiconductor cooling system comprising:
a semiconductor chip comprising:
a plurality of semiconductor devices,
a plurality of thermally insulating vias surrounding at least one semiconductor device, the plurality of thermally insulating vias providing a thermal insulating wall to confine heat output from the at least one semiconductor device, and
a plurality of electrically inactive metal-filled vias adjacent to the at least one semiconductor device, the plurality of metal-filled vias moving the heat output from the at least one semiconductor device to a side of the semiconductor chip; and
a thermoelectric cooler in contact with the side of the semiconductor chip.

10. A semiconductor cooling system comprising:
a semiconductor chip comprising a semiconductor portion having a plurality of semiconductor devices and a metallization portion having a plurality of electrically inactive metal-filled vias and no semiconductor devices, the semiconductor chip having a back (inactive side) and a front (active) side wherein the plurality of metal-filled vias extending through the metallization portion to a front side of the die; and
a thermoelectric cooler in contact with the front side of the semiconductor chip.

11. The semiconductor cooling system of claim 10 further comprising a plurality of thermally insulating vias extending through the semiconductor portion and surrounding at least one semiconductor device, the plurality of thermally insulating vias providing a thermal insulating wall to confine heat output from the at least one semiconductor device.

12. The semiconductor cooling system of claim 10 wherein the metal-filled vias are situated adjacent to, and not in contact with, the plurality of semiconductor devices.

13. The semiconductor cooling system of claim 11 wherein the plurality of metal-filled vias extend only through the metallization portion and the plurality of insulating vias extend only through the semiconductor portion.

14. The semiconductor cooling system of claim 10 further comprising a printed circuit board to which a back side of the semiconductor chip is joined and a plurality of wires extending from a periphery of the front side of the semiconductor chip and making electrical contact with the printed circuit board and wherein the thermoelectric cooler is in contact with a central portion of the front side of the die.

15. The semiconductor cooling system of claim 10 further comprising a thermally conducting lid in contact with the thermoelectric cooler and a heat sink in contact with the thermally conducting lid.

16. The semiconductor cooling system of claim 10 further comprising a thermal sensor to control an output of the thermoelectric cooler.

17. The semiconductor cooling system of claim 16 wherein the thermal sensor and thermoelectric cooler are configured in a closed-loop feedback system.

18. A method of cooling a semiconductor chip comprising the steps of:
placing a plurality of electrically inactive metal-filled vias adjacent to at least one semiconductor device to be cooled;
surrounding the at least one semiconductor device to be cooled with a plurality of thermally insulating vias so as to provide a thermally insulating wall to confine heat output from the at least one semiconductor device; and
contacting the plurality of metal-filled vias with a thermoelectric cooler so as to remove excess heat from the semiconductor device.

19. The method of claim 18 further comprising the step of controlling the thermoelectric cooler with a thermal sensor.

20. The method of claim 19 wherein the thermal sensor is in a closed loop feedback system with the thermoelectric cooler.

* * * * *